United States Patent
Mima et al.

(10) Patent No.: US 10,208,899 B2
(45) Date of Patent: Feb. 19, 2019

(54) LIGHT SOURCE INCLUDING WAVELENGTH CONVERTER

(71) Applicant: Panasonic Intellectual Property Management Co., Ltd., Osaka (JP)

(72) Inventors: Kazuma Mima, Hyogo (JP); Yoshihisa Nagasaki, Osaka (JP); Takahiro Hamada, Osaka (JP); Takashi Ohbayashi, Osaka (JP); Yukihiko Sugio, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 287 days.

(21) Appl. No.: 15/200,099

(22) Filed: Jul. 1, 2016

(65) Prior Publication Data
US 2017/0023188 A1 Jan. 26, 2017

(30) Foreign Application Priority Data
Jul. 22, 2015 (JP) .................................. 2015-145062

(51) Int. Cl.
*F21V 9/30* (2018.01)
*F21K 9/64* (2016.01)
(Continued)

(52) U.S. Cl.
CPC ................ *F21K 9/64* (2016.08); *C09K 11/02* (2013.01); *C09K 11/7706* (2013.01);
(Continued)

(58) Field of Classification Search
CPC ........... F21K 9/64; H05B 33/22; H05B 33/20; C09K 11/7706; C09K 11/02; H01S 5/005;
(Continued)

(56) References Cited

U.S. PATENT DOCUMENTS 5,813,753 A * 9/1998 Vriens ................... H01L 33/502
257/13
9,341,748 B2 * 5/2016 Krasnov ................ G02B 1/105
(Continued)

FOREIGN PATENT DOCUMENTS

CN 104155708 A * 11/2014
JP 2009204759 A * 9/2009
(Continued)

OTHER PUBLICATIONS

Refractive Index.info, silicon dioxide refractive index, 2008, https://refractiveindex.info/?shelf=main&book=SiO2&page=Malitson.*
Espacenet English translation of CN 104155708 A.*
Espacenet English translation of JP 2009204759 A.*

*Primary Examiner* — Sean P Gramling
*Assistant Examiner* — Omar Rojas Cadima
(74) *Attorney, Agent, or Firm* — McDermott Will & Emery LLP (57) ABSTRACT

A light source includes a semiconductor light emitting device; and a wavelength converter. The wavelength converter includes: a substrate; a phosphor layer disposed on the substrate; and a light reflective layer disposed on the substrate so as to surround the phosphor layer. The phosphor layer includes phosphor particles and a first matrix material in which the phosphor particles are dispersed. The light reflective layer includes inorganic compound particles and a second matrix material in which the inorganic compound particles are dispersed. The inorganic compound particles have a refractive index higher than that of the first matrix material. The first matrix material has a refractive index higher than that of the phosphor particles. The phosphor particles have a refractive index higher than that of the second matrix material.

15 Claims, 2 Drawing Sheets

(51) Int. Cl.
| | |
|---|---|
| *H01S 5/00* | (2006.01) |
| *C09K 11/02* | (2006.01) |
| *C09K 11/77* | (2006.01) |
| *H05B 33/20* | (2006.01) |
| *H05B 33/22* | (2006.01) |
| *H01L 33/50* | (2010.01) |
| *F21Y 115/30* | (2016.01) |
| *H01L 33/46* | (2010.01) |
| *H01S 5/323* | (2006.01) |

(52) U.S. Cl.
CPC ............. *H01S 5/005* (2013.01); *H05B 33/20* (2013.01); *H05B 33/22* (2013.01); *F21Y 9/30* (2018.02); *F21Y 2115/30* (2016.08); *H01L 33/46* (2013.01); *H01L 33/50* (2013.01); *H01S 5/32341* (2013.01)

(58) Field of Classification Search
CPC ........ H01S 5/32341; F21V 9/30; H01L 33/46; H01L 33/50; F21Y 2115/30
See application file for complete search history.

(56) References Cited

U.S. PATENT DOCUMENTS

| | | | |
|---|---|---|---|
| 2007/0278935 A1* | 12/2007 | Harada | C09K 11/0883 313/503 |
| 2013/0181246 A1* | 7/2013 | Wu | G02B 6/001 257/98 |
| 2013/0271999 A1* | 10/2013 | Shiobara | F21S 43/33 362/341 |
| 2014/0071683 A1 | 3/2014 | Hamada et al. | |
| 2014/0072812 A1 | 3/2014 | Hamada et al. | |
| 2014/0353702 A1 | 12/2014 | Nagao et al. | |
| 2015/0102722 A1 | 4/2015 | Ohbayashi et al. | |
| 2016/0137918 A1* | 5/2016 | Hori | C09K 11/7731 428/1.1 |
| 2017/0009131 A1* | 1/2017 | Wataya | C09K 11/616 |

FOREIGN PATENT DOCUMENTS

| | | |
|---|---|---|
| JP | 2015-008278 | 1/2015 |
| JP | 2015-097256 | 5/2015 |
| WO | 2013/172025 | 11/2013 |
| WO | 2013/175773 | 11/2013 |

* cited by examiner

LIGHT SOURCE INCLUDING WAVELENGTH CONVERTER

BACKGROUND

1. Technical Field

The present disclosure relates to a light source including a semiconductor light emitting device and a wavelength converter.

2. Description of the Related Art

Recently, light sources including a combination of a semiconductor light emitting device and a phosphor have been developed, and development of light sources having higher luminance and higher output has been required. In particular, development of light sources including a wavelength converter having resistance to heat and UV and having high output are being developed.

For example, International Publication No. WO2013/172025 discloses a wavelength converter comprising a phosphor dispersed in zinc oxide, which is an inorganic matrix having a refractive index similar to that of the phosphor, to reduce light scattering and to achieve a high light output, and discloses a light source including the wavelength converter.

SUMMARY

In one general aspect, the techniques disclosed here feature a light source comprising a semiconductor light emitting device; and a wavelength converter. The wavelength converter includes: a substrate; a phosphor layer disposed on the substrate; and a light reflective layer disposed on the substrate so as to surround the phosphor layer. The phosphor layer includes phosphor particles and a first matrix material in which the phosphor particles are dispersed. The light reflective layer includes inorganic compound particles and a second matrix material in which the inorganic compound particles are dispersed. The inorganic compound particles have a refractive index higher than that of the first matrix material. The first matrix material has a refractive index higher than that of the phosphor particles. The phosphor particles have a refractive index higher than that of the second matrix material.

The present disclosure can provide a light source having a high luminance and a high luminous efficiency by preventing the guided wave of light in the wavelength converter and increasing the excitation light extraction efficiency and the converted light extraction efficiency.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Underlying Knowledge Forming Basis of the Present Disclosure

It has been known that a wavelength converter comprising a phosphor dispersed in a matrix of zinc oxide having a refractive index similar to that of the phosphor can improve the light output by preventing light scattering at the interface between the phosphor and the matrix. However, the results of investigation by the present inventors revealed that such a wavelength converter has a problem that excitation light and converted light are wave-guided and spread in the wavelength converter to cause reductions in the excitation light extraction efficiency and the converted light extraction efficiency, resulting in reductions in luminance and luminous efficiency.

Accordingly, the present inventors have diligently studied in order to solve the above-mentioned problems and, as a result, have arrived at a light source that can enhance the luminance and the luminous efficiency by preventing the guided wave of light in the wavelength converter and increasing the excitation light extraction efficiency and the converted light extraction efficiency.

The present disclosure will now be described in detail by specific embodiments. It is needless to say that the present disclosure is not limited to these embodiments and can be appropriately modified within the technical scope of the present disclosure.

The outlines of the wavelength converter and the light source comprising the wavelength converter according to an embodiment of the present disclosure are as follows.

The light source according to an embodiment of the present disclosure includes a semiconductor light emitting device (i.e. semiconductor light emitter) and a wavelength converter that receives light emitted from the semiconductor light emitting device and emits converted light, the wavelength of the converted light being different from the wavelength of the light from the semiconductor light emitting device. The wavelength converter includes a substrate, a phosphor layer disposed on the substrate, and a light reflective layer disposed on the substrate so as to surround the phosphor layer. The phosphor layer includes phosphor particles and a first matrix material in which the phosphor particles are dispersed. The light reflective layer includes inorganic compound particles and a second matrix material in which the inorganic compound particles are dispersed. The refractive index of the inorganic compound particles is higher than that of the first matrix material, the refractive index of the first matrix material is higher than that of the phosphor particles, and the refractive index of the phosphor particles is higher than that of the second matrix material.

The first matrix material may be zinc oxide. The second matrix material may be at least one of glass and compounds having siloxane skeletons. The inorganic compound particles may contain at least one selected from the group consisting of titanium oxide, zirconium oxide, niobium oxide, tantalum oxide, and barium titanate.

The phosphor layer may have a first surface facing the substrate and a second surface opposite to the first surface. The substrate may transmit light having a wavelength of 470 nm or less. On the second surface of the phosphor layer, a visible light transmissive film having a refractive index lower than that of the first matrix may be disposed. The substrate may transmit light having a wavelength equal to or more than 100 nm and equal to or less than 470 nm. The substrate may transmit light having a wavelength equal to or more than 250 nm and equal to or less than 470 nm. The visible light transmissive film may contain at least one selected from the group consisting of glass, compounds having siloxane skeletons, silicon dioxide, and barium fluoride.

The phosphor layer may have a first surface facing the substrate and a second surface opposite to the first surface. The substrate may reflect light having a wavelength of 380 to 780 nm. On the second surface of the phosphor layer, a layer containing first particles having a refractive index lower than that of the phosphor particles may be disposed. The first particles may contain at least one selected from the group consisting of silicon dioxide, barium sulfate, and magnesium oxide.

The substrate may have a third surface. The phosphor layer may be disposed on the third surface of the substrate and have a first thickness. The reflective layer may be disposed on the third surface of the substrate and have a second thickness equal to the first thickness.

The substrate may have a third surface. The phosphor layer may be disposed on the third surface of the substrate and have a first thickness. The reflective layer may be disposed on the third surface of the substrate and have a second thickness smaller than that of the first thickness.

The substrate may have a third surface. The phosphor layer may be disposed on the third surface of the substrate and have a first thickness. The reflective layer may be disposed on the third surface of the substrate and have a second thickness larger than that the first thickness.

The substrate may have a third surface. The phosphor layer may be disposed on the third surface of the substrate and have a first surface on the substrate side and a second surface on the opposite side of the first surface. The reflective layer may be disposed on the third surface of the substrate and on the second surface of the phosphor layer and have an opening on the second surface.

A light source according to another embodiment of the present disclosure includes a semiconductor light emitting device and a wavelength converter that receives light emitted from the semiconductor light emitting device and emits converted light, the wavelength of the converted light being different from the wavelength of the light from the semiconductor light emitting device. The wavelength converter includes a substrate, a phosphor layer disposed on the substrate and having a first surface facing the substrate and a second surface opposite to the first surface, and a light reflective layer disposed on the second surface of the phosphor layer and having an opening on the second surface. The phosphor layer includes phosphor particles and a first matrix material in which the phosphor particles are dispersed. The light reflective layer includes inorganic compound particles and a second matrix material in which the inorganic compound particles are dispersed. The refractive index of the inorganic compound particles is higher than that of the first matrix material, the refractive index of the first matrix material is higher than that of the phosphor particles, and the refractive index of the phosphor particles is higher than that of the second matrix material.

These structures can prevent the guided wave of light in the wavelength converter and increase the excitation light extraction efficiency and the converted light extraction efficiency to provide a light source having a high luminance and a high luminous efficiency. Embodiments of the present disclosure may now be described with reference to the drawings.

First Embodiment

Figure 1:
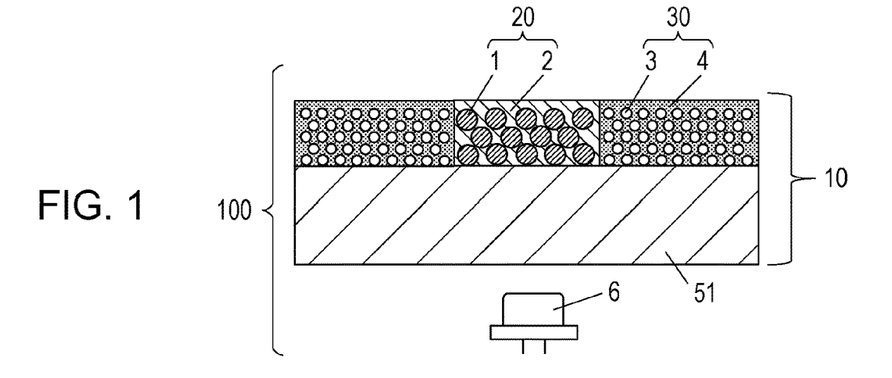
FIG. 1 is a configuration diagram schematically illustrating the structure of a light source according to First Embodiment of the present disclosure.

FIG. 1 schematically illustrates the structure of a transmission-type light source 100 according to First Embodiment of the present disclosure. The transmission-type light source 100 comprises a wavelength converter 10 and a semiconductor light emitting device 6.

The semiconductor light emitting device 6 emits excitation light. The excitation light may have any wavelength and light energy density. For example, a laser diode (hereinafter, referred to as LD) can be used as the semiconductor light emitting device 6. The semiconductor light emitting device 6 may be made of one LD or may be an optical combination of a plurality of LDs.

In this embodiment, a case that the semiconductor light emitting device 6 is an LD that emits light having a wavelength of 445 nm will be described.

The wavelength converter 10 comprises a light transmissive substrate 51, a phosphor layer 20 disposed on the light transmissive substrate 51, and a light reflective layer 30 surrounding the phosphor layer 20. The light reflective layer 30 is also disposed on the light transmissive substrate 51. For example, the phosphor layer 20 and the light reflective layer 30 are disposed on a main surface of the light transmissive substrate 51. The phosphor layer 20 and the light reflective layer 30 may or may not be in contact with the main surface of the light transmissive substrate 51. The light reflective layer 30 may or may not be in contact with the phosphor layer 20. The thickness of the light reflective layer 30 may be the same as that of the phosphor layer 20. The excitation light emitted from the semiconductor light emitting device 6 enters the bottom of the wavelength converter 10. In this specification, the term "top" refers to the direction from the substrate to the phosphor layer, and the term "bottom" refers to the direction from the phosphor layer to the substrate. The wavelength converter 10 converts at least a part of the incident light into light having a wavelength band different from that of the incident light, and emits the light. For example, the wavelength converter 10 emits light of a longer wavelength than that of the incident light.

The phosphor layer 20 comprises phosphor particles 1 and a first matrix 2 embedding the phosphor particles 1. The light reflective layer 30 comprises inorganic compound particles 3 and a second matrix 4 embedding the inorganic compound particles 3. The refractive index of the inorganic compound particles 3 is higher than that of the first matrix 2, the refractive index of the first matrix 2 is higher than that of the phosphor particles 1, and the refractive index of the phosphor particles 1 is higher than that of the second matrix 4.

The refractive index of the first matrix 2 is larger than that of the phosphor particles 1, and thereby the light incident on the surface of the phosphor particles 1 is prevented from scattering, efficiently extracting the light to the outside. Furthermore, the refractive index of the inorganic compound particles 3 is larger than those of the first matrix 2, the phosphor particles 1, and the second matrix 4, and thereby the light wave-guided in the phosphor layer 20 is reflected at the interface with the light reflective layer 30, efficiently extracting the light from the upper surface of the phosphor layer 20 to the outside. As a result, the luminance is improved. The upper surface of the phosphor layer 20 is the surface on the opposite side to the substrate 51 side of the phosphor layer 20.

The phosphor particles 1 may have any excitation wavelength, emission light wavelength, and particle diameter that are generally used in light emitting devices. For example, YAG (yttrium/aluminum/garnet) or β-SiAlON (Sialon) can be used as the phosphor particles 1. In particular, the wavelength of light exciting the phosphor and the wavelength of light to be emitted can be appropriately selected depending on the use of the transmission-type light source 100.

The first matrix 2 is a medium, such as a resin, glass, or transparent crystal. In particular, the material of a matrix having a refractive index higher than that of the phosphor particles 1 may be zinc oxide.

The second matrix 4 may contain at least one selected from glass and compounds having siloxane skeletons.

The inorganic compound particles 3 may contain at least one selected from the group consisting of titanium oxide, zirconium oxide, niobium oxide, tantalum oxide, and barium titanate.

The light transmissive substrate 51 may transmit light having a wavelength of 470 nm or less. The light transmissive substrate 51 may transmit light having a wavelength equal to or more than 100 nm and equal to or less than 470 nm. Further, The light transmissive substrate 51 may transmit light having a wavelength equal to or more than 250 nm and equal to or less than 470 nm. The base material of the light transmissive substrate 51 may be a medium, such as a resin, glass, or transparent crystal, and may be provided with an antireflection film and a dielectric multilayer film.

The base material of the light transmissive substrate 51 may be, for example, one selected from the group consisting of glass, quartz, silicon oxide, sapphire, gallium nitride, and zinc oxide.

The antireflection film may be a film that prevents reflection of light having a wavelength of 470 nm or less. The antireflection film prevents reflection of light incident on the bottom of the wavelength converter 10, resulting in an improvement in light extraction efficiency. The refractive index of the base material may be higher than that of the antireflection film, and the refractive index of the antireflection film may be higher than those of other media.

The antireflection film may contain, for example, at least one selected from the group consisting of titanium oxide, zirconium oxide, tantalum oxide, cerium oxide, niobium oxide, tungsten oxide, silicon monoxide, silicon dioxide, cesium fluoride, calcium fluoride, and magnesium fluoride.

The dielectric multilayer film may be a multilayer film that reflects light having a wavelength of 470 nm or more. The dielectric multilayer film reflects light having a wavelength other than that of incident light to prevent converted light from being emitted from the bottom of the phosphor layer 20, resulting in an improvement in the light extraction efficiency. The multilayer film is desirably composed of two or more materials forming a low refractive index layer and a high refractive index layer. The high refractive index layer desirably has a refractive index higher than that of the first matrix.

The low refractive index layer may contain, for example, silicon oxide.

The high refractive index layer may contain, for example, at least one selected from the group consisting of titanium oxide, zirconium oxide, tantalum oxide, cerium oxide, niobium oxide, tungsten oxide, silicon monoxide, silicon dioxide, cesium fluoride, calcium fluoride, and magnesium fluoride.

The transmission-type light source 100 of this embodiment can be used as a light source in, for example, an ordinary light system, such as a ceiling light; a special lighting system, such as a spotlight, a light for stadium, or a light for studio; a lighting system for a vehicle, such as a head lamp; a projector or head up display projector; a light for an endoscope; an imaging apparatus, such as a digital camera, a mobile phone, or a smartphone; or a liquid crystal display of, for example, a monitor for a personal computer (PC), a notebook personal computer, a television, a personal digital assistant (PDA), a smartphone, a tablet PC, or a mobile phone.

A method of producing a wavelength converter 10 of the embodiment will now be described.

In First Embodiment, a phosphor layer 20 composed of phosphor particles 1 and a first matrix 2 is formed, and a light reflective layer 30 composed of inorganic compound particles 3 and a second matrix 4 is then formed.

A case of using zinc oxide as the first matrix 2 will be described. First, a thin layer of zinc oxide is formed on the third surface of the light transmissive substrate 51. The thin film of zinc oxide is formed by vacuum deposition, such as electron beam evaporation, reactive plasma evaporation, sputtering, or pulse laser deposition. Subsequently, a layer of phosphor particles 1 is formed on the thin film of zinc oxide formed on the light transmissive substrate 51 (that is, the phosphor layer 20 before the formation of the first matrix 2). The layer of phosphor particles 1 is formed by, for example, the following method. That is, a phosphor dispersion liquid in which the phosphor particles 1 are dispersed is first prepared. Subsequently, the light transmissive substrate 51 provided with the zinc oxide thin film is placed in the phosphor dispersion liquid, followed by electrophoresis to accumulate the phosphor particles 1 on the zinc oxide thin film. As a result, a layer of phosphor particles 1 can be formed. Alternatively, a layer of phosphor particles 1 may be formed by precipitating the phosphor particles 1 in the phosphor dispersion liquid. Further alternatively, a layer of phosphor particles 1 may be formed by a printing process using a paste containing the phosphor particles 1 dispersed therein.

Subsequently, a first matrix 2 of zinc oxide can be formed among the phosphor particles 1 from the zinc oxide thin film on the light transmissive substrate 51 by a solution growth method using a solution containing Zn. The solution growth method used is, for example, chemical bath deposition performed under atmospheric pressure, hydrothermal synthesis performed under a pressure higher than atmospheric pressure, or electrochemical deposition performed by applying a voltage or current. The solution for crystal growth is, for example, an aqueous zinc nitrate solution containing hexamethylenetetramine.

Subsequently, a light reflective layer 30 is formed by a printing process using a paste containing inorganic compound particles 3 and a second matrix 4 dispersed therein. The printing process used is, for example, screen printing, relief printing, gravure printing, or offset printing.

Second Embodiment

Figure 2:
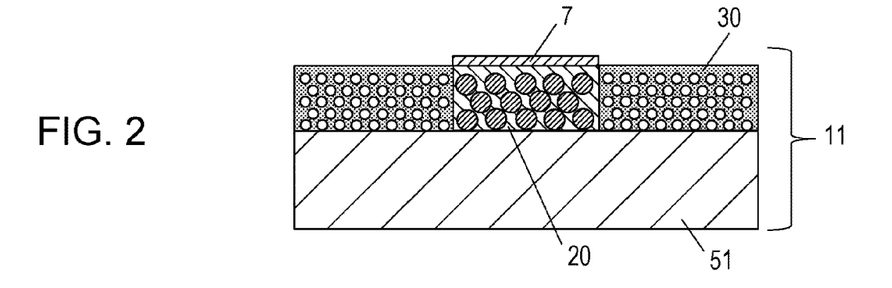
FIG. 2 is a configuration diagram schematically illustrating the structure of a wavelength converter according to Second Embodiment.

FIG. 2 schematically illustrates the structure of a wavelength converter 11 according to Second Embodiment of the present disclosure. The same members as those in First Embodiment are denoted by the same reference symbols, and the descriptions thereof are omitted. The wavelength converter 11 comprises a light transmissive substrate 51, a phosphor layer 20, a light reflective layer 30, and an upper layer film 7 disposed on the phosphor layer 20. In this embodiment, as in First Embodiment, a semiconductor light emitting device 6 emitting excitation light may be provided. The excitation light emitted from the semiconductor light emitting device 6 enters the bottom of the wavelength converter 11. The wavelength converter 11 converts at least a part of incident light from the semiconductor light emitting device 6 into light having a wavelength band different from that of the incident light, and emits the light. For example, the wavelength converter 11 emits light of a longer wavelength than that of the incident light.

The upper layer film 7 may be a visible light transmissive film and may have a refractive index lower than that of the first matrix 2 of the phosphor layer 20.

In Second Embodiment, the difference in refractive index between the first matrix and the upper layer film 7 and the difference in refractive index between the upper layer film 7 and the other medium are smaller than the difference in refractive index between the first matrix and the other medium. Consequently, the reflection of light at the interfaces is prevented, efficiently extracting the light from the upper surface of the phosphor layer 20 to the outside. As a result, the luminance is improved.

The upper layer film 7 may contain at least one selected from the group consisting of glass, compounds having siloxane skeletons, silicon dioxide, and barium fluoride.

The wavelength converter 11 of Second Embodiment can be used for the same purposes as those in wavelength converter 10 of First Embodiment.

The method of producing the wavelength converter 11 of this embodiment includes a step of forming an upper layer film 7 by a printing process, in addition to the production process of First Embodiment. The printing process used is, for example, screen printing, relief printing, gravure printing, or offset printing.

Third Embodiment

Figure 3:
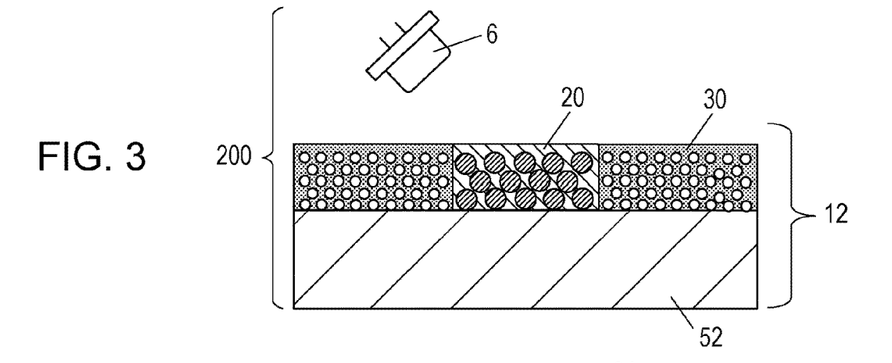
FIG. 3 is a configuration diagram schematically illustrating the structure of a light source according to Third Embodiment.

FIG. 3 schematically illustrates the structure of a reflection-type light source 200 according to Third Embodiment of the present disclosure. The same members as those in First Embodiment are denoted by the same reference symbols, and the descriptions thereof are omitted. The reflection-type light source 200 comprises a wavelength converter 12 and a semiconductor light emitting device 6. The wavelength converter 12 comprises a reflecting substrate 52, a phosphor layer 20, and a light reflective layer 30. For example, the phosphor layer 20 and the light reflective layer 30 are disposed on a main surface of the reflecting substrate 52. The phosphor layer 20 and the light reflective layer 30 may or may not be in contact with the main surface of the reflecting substrate 52. The excitation light emitted from the semiconductor light emitting device 6 enters the top of the wavelength converter 12. The wavelength converter 12 converts at least a part of the incident light entered from the top into light having a wavelength band different from that of the incident light, and emits the light. For example, the wavelength converter 12 emits light of a longer wavelength than that of the incident light.

The reflecting substrate 52 may be made of a material that reflects light having a wavelength of 380 to 780 nm and may contain at least one selected from, for example, silicon and aluminum. The base material of the reflecting substrate 52 may be any material and may be provided with a reflection film that reflects light having a wavelength of 380 to 780 nm.

The reflecting substrate 52 and the light reflective layer 30 reflect converted light to efficiently extract the light from the upper surface of the phosphor layer 20 to the outside, resulting in an improvement in luminance.

The wavelength converter 12 and the reflection-type light source 200 according to Third Embodiment can be used for the same purposes as those in the wavelength converter 10 and the transmission-type light source 100 of First Embodiment.

The wavelength converter 12 of this embodiment can be formed by the same production process as that in First Embodiment.

Fourth Embodiment

Figure 4:
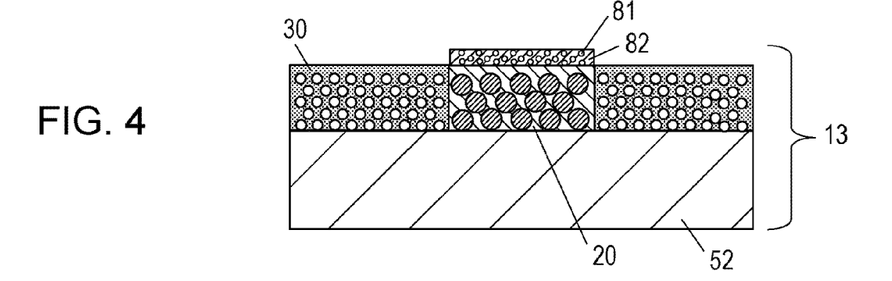
FIG. 4 is a configuration diagram schematically illustrating the structure of a wavelength converter according to Fourth Embodiment.

FIG. 4 schematically illustrates the structure of a wavelength converter 13 according to Fourth Embodiment of the present disclosure. The same members as those in Third Embodiment are denoted by the same reference symbols, and the descriptions thereof are omitted. The wavelength converter 13 comprises a reflecting substrate 52, a phosphor layer 20, a light reflective layer 30, an upper layer matrix 82 disposed on the phosphor layer 20, and an upper layer particles 81 dispersed in the upper layer matrix 82. In this embodiment, as in Third Embodiment, a semiconductor light emitting device 6 emitting excitation light may be provided. The excitation light emitted from the semiconductor light emitting device 6 enters the top of the wavelength converter 13. The wavelength converter 13 converts at least a part of the incident light entered from the top into light having a wavelength band different from that of the incident light, and emits the light. For example, the wavelength converter 13 emits light of a longer wavelength than that of the incident light.

The upper layer particles 81 may have a refractive index lower than that of the phosphor particles 1. The upper layer particles 81 may contain, for example, at least one selected from the group consisting of silicon dioxide, barium sulfate, and magnesium oxide.

Since the refractive index of the upper layer particles 81 is lower than that of the phosphor particles 1, scattering of light is prevented, and direct reflection of incident light is also prevented. Consequently, light can be efficiently extracted from the upper surface of the phosphor layer 20 to the outside, resulting in an improvement in luminance.

The wavelength converter 13 of Fourth Embodiment can be used for the same purposes as that in the wavelength converter 10 of First Embodiment.

The method of producing the wavelength converter 13 of this embodiment includes a step of forming an upper layer particles 81 and an upper layer matrix 82 by a printing process using a paste containing upper layer particles 81 and an upper layer matrix 82 dispersed therein, in addition to the production process of Third Embodiment. The printing process used is, for example, screen printing, relief printing, gravure printing, or offset printing.

Fifth Embodiment

Figure 5A:
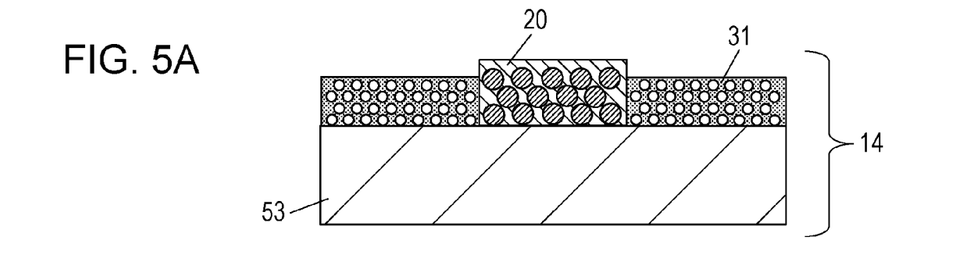
FIGS. 5A to 5D are configuration diagrams schematically illustrating the structures of wavelength converters according to Fifth and Eighth Embodiments.

FIG. 5A schematically illustrates the structure of a wavelength converter 14 according to Fifth Embodiment of the present disclosure. The same members as those in First to Fourth Embodiments are denoted by the same reference symbols, and the descriptions thereof are omitted. The wavelength converter 14 comprises a substrate 53, a phosphor layer 20 disposed on the substrate 53, and a light reflective layer 31 surrounding the phosphor layer 20. The substrate 53 is a light transmissive substrate 51 or a light reflecting substrate 52. For example, the phosphor layer 20 and the light reflective layer 31 are disposed on a main surface of the substrate 53. The phosphor layer 20 and the light reflective layer 31 may or may not be in contact with the main surface of the substrate 53. The light reflective layer 31 may or may not be in contact with the phosphor layer 20.

The light reflective layer 31 of this embodiment has the same structure as that of the light reflective layer 30 of First Embodiment, excluding the thickness. The thickness of the light reflective layer 31 may be smaller than that of the phosphor layer 20. In such a case, the thickness of the light reflective layer 31 may be a half or more of the thickness of the phosphor layer 20. As a result, light can be efficiently extracted from the upper surface of the phosphor layer 20 to the outside, resulting in an improvement in luminance.

In this embodiment, as in First or Third Embodiment, a semiconductor light emitting device 6 emitting excitation light may be provided. The excitation light emitted from the semiconductor light emitting device 6 enters the wavelength converter 14. The wavelength converter 14 converts at least a part of the incident light entered from the top into light having a wavelength band different from that of the incident light, and emits the light. For example, the wavelength converter 14 emits light of a longer wavelength than that of the incident light. In this embodiment, as in Second or Fourth Embodiment, an upper layer film 7 may be disposed on the phosphor layer 20, or a layer containing an upper layer matrix 82 and upper layer particles 81 may be disposed on the phosphor layer 20.

The wavelength converter 14 of this embodiment can be formed by the same production process as that in First Embodiment, except that the thickness of the layer formed in the printing process is varied. That is, the light reflective layer 31 is formed so as to have a thickness smaller than that of the light reflective layer 30 of First Embodiment.

Sixth Embodiment

Figure 5B:
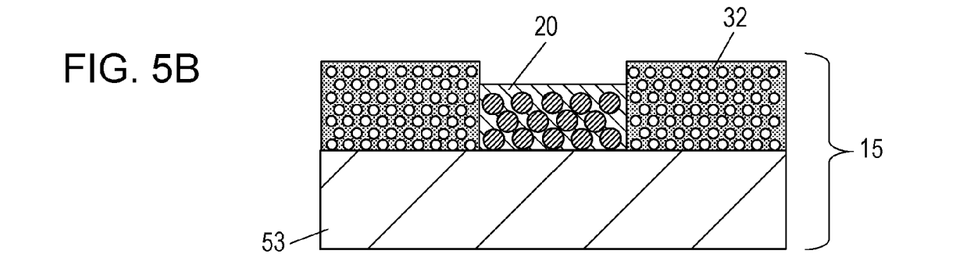

FIG. 5B schematically illustrates the structure of a wavelength converter 15 according to Sixth Embodiment of the present disclosure. The same members as those in First to Fifth Embodiments are denoted by the same reference symbols, and the descriptions thereof are omitted. The wavelength converter 15 comprises a substrate 53, a phosphor layer 20, and a light reflective layer 32 surrounding the phosphor layer 20. For example, the phosphor layer 20 and the light reflective layer 32 are disposed on a main surface of the substrate 53. The phosphor layer 20 and the light reflective layer 32 may or may not be in contact with the main surface of the substrate 53. The light reflective layer 32 may or may not be in contact with the phosphor layer 20.

The light reflective layer 32 of this embodiment has the same structure as that of the light reflective layer 30 of First Embodiment, excluding the thickness. The thickness of the light reflective layer 32 may be larger than that of the phosphor layer 20. In such a case, the difference in thickness between the light reflective layer 32 and the phosphor layer 20 may be one tenth or less, desirably one twentieth or less, of the diameter of the phosphor layer 20. As a result, light can be efficiently extracted from the upper surface of the phosphor layer 20 to the outside, resulting in an improvement in luminance.

The wavelength converter 15 of this embodiment can be formed by the same production process as that in First Embodiment, except that the thickness of the layer formed in the printing process is varied. That is, the light reflective layer 32 is formed so as to have a thickness larger than that of the light reflective layer 30 of First Embodiment.

As in First or Third Embodiment, a semiconductor light emitting device 6 emitting excitation light may be provided. The excitation light emitted from the semiconductor light emitting device 6 enters the wavelength converter 15. The wavelength converter 15 converts at least a part of the incident light entered from the top into light having a wavelength band different from that of the incident light, and emits the light. For example, the wavelength converter 15 emits light of a longer wavelength than that of the incident light. In this embodiment, as in Second or Fourth Embodiment, an upper layer film 7 may be disposed on the phosphor layer 20, or a layer containing an upper layer matrix 82 and upper layer particles 81 may be disposed on the phosphor layer 20.

Seventh Embodiment

Figure 5C:
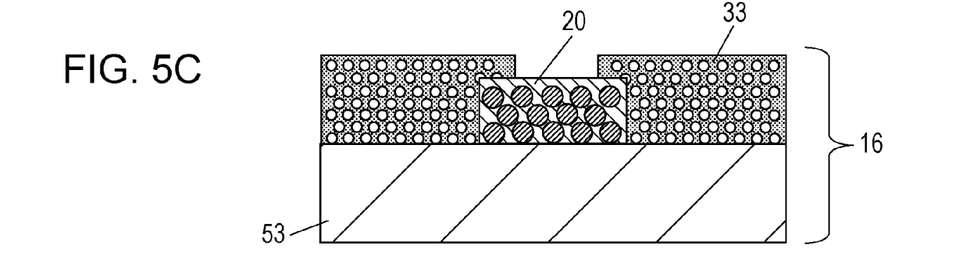

FIG. 5C schematically illustrates the structure of a wavelength converter 16 according to Seventh Embodiment of the present disclosure. The same members as those in First to Sixth Embodiments are denoted by the same reference symbols, and the descriptions thereof are omitted. The wavelength converter 16 comprises a substrate 53, a phosphor layer 20, and a light reflective layer 33 surrounding the phosphor layer 20. For example, the phosphor layer 20 and the light reflective layer 33 are disposed on a main surface of the substrate 53. The phosphor layer 20 and the light reflective layer 33 may or may not be in contact with the main surface of the substrate 53. The light reflective layer 33 may or may not be in contact with the phosphor layer 20.

The light reflective layer 33 of this embodiment has the same structure as that of the light reflective layer 32 of Sixth Embodiment, excluding the shape. The light reflective layer 33 may be in contact with the upper surface of the phosphor layer 20. Specifically, the light reflective layer 33 is disposed so as to cover the upper layer of the phosphor layer 20 excluding a part of the upper layer. As a result, an opening exposing a part of the upper layer of the phosphor layer 20 is formed. This opening may have any shape and may be a circle or a polygon. When the thickness of the light reflective layer 33 is larger than that of the phosphor layer 20, the difference in thickness between the light reflective layer 33 and the phosphor layer 20 may be one tenth or less, desirably one twentieth or less, of the diameter (of the circumscribed circle) of the opening. As a result, light can be efficiently extracted from the upper surface of the phosphor layer 20 to the outside, resulting in an improvement in luminance.

In this embodiment, as in First or Third Embodiment, a semiconductor light emitting device 6 emitting excitation light may be provided. The excitation light emitted from the semiconductor light emitting device 6 enters the wavelength converter 16. The wavelength converter 16 converts at least a part of the incident light entered from the top into light having a wavelength band different from that of the incident light, and emits the light. For example, the wavelength converter 16 emits light of a longer wavelength than that of the incident light. In this embodiment, as in Second or Fourth Embodiment, an upper layer film 7 may be disposed on the phosphor layer 20, or a layer containing an upper layer matrix 82 and upper layer particles 81 may be disposed on the phosphor layer 20. The layer film 7 or the layer containing an upper layer matrix 82 and upper layer particles 81 may cover the entire upper surface of the phosphor layer 20 or may cover only the area exposing from the opening.

The wavelength converter 16 of this embodiment can be formed by the same production process as that in First Embodiment, excluding the thickness and the range of the layer formed in the printing process. That is, the light reflective layer 33 is formed such that the thickness of the light reflective layer 33 disposed on the third surface, where the phosphor layer 20 is not disposed, is larger than the thickness of the light reflective layer 30 of First Embodiment and that the light reflective layer 33 is also disposed on a part of the phosphor layer 20.

Eighth Embodiment

Figure 5D:
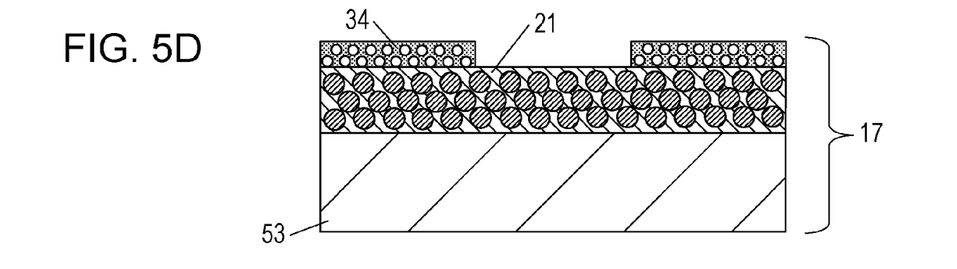

FIG. 5D schematically illustrates the structure of a wavelength converter 17 according to Eighth Embodiment of the present disclosure. The same members as those in First to Seventh Embodiments are denoted by the same reference symbols, and the descriptions thereof are omitted. The wavelength converter 17 comprises a substrate 53, a phosphor layer 21 disposed on the substrate 53 and having a first surface on the substrate 53 side and a second surface on the opposite side of the first surface, and a light reflective layer 34 disposed on the second surface of the phosphor layer 21 and having an opening on the second surface. The phosphor layer 21 of this embodiment has the same structure as that of the phosphor layer 20 of First Embodiment, excluding the area. The phosphor layer 21 covers the entire or almost the entire main surface of the substrate 53. If the opening on the phosphor layer 21 may be narrow, the phosphor layer 21 may have the same area as that of the phosphor layer 20.

The light reflective layer 34 of this embodiment may have the same structure as that of the light reflective layer 33 of Seventh Embodiment, excluding the shape. The light reflective layer 34 is not in contact with the side face of the phosphor layer 21 and the substrate 53. The phosphor layer 21 is disposed between the light reflective layer 34 and the substrate 53. The light reflective layer 34 may be in contact with the second surface of the phosphor layer 21. Specifically, the light reflective layer 34 is disposed so as to cover the second surface of the phosphor layer 21 excluding a part of the second layer. As a result, an opening exposing a part of the second surface of the phosphor layer 21 is formed. The opening may have any shape and may be a circle or a polygon. If the width of the light reflective layer 34 (i.e., the shortest distance from the outside end of the light reflective layer 34 up to the end of the opening) is twice or more, more desirably four times or more, the diameter (of the circumscribed circle) of the opening, light can be efficiently extracted from the first surface of the phosphor layer 21 to the outside, resulting in an improvement in luminance.

In this embodiment, as in First or Third Embodiment, a semiconductor light emitting device 6 emitting excitation light may be provided. The excitation light emitted from the semiconductor light emitting device 6 enters the wavelength converter 17. The wavelength converter 17 converts at least a part of the incident light entered from the top into light having a wavelength band different from that of the incident light, and emits the light. For example, wavelength converter 17 emits light of a longer wavelength than that of the incident light. In this embodiment, as in Second or Fourth Embodiment, an upper layer film 7 may be disposed on the phosphor layer 21, or a layer containing an upper layer matrix 82 and upper layer particles 81 may be disposed on the phosphor layer 21. The upper layer film 7 or the layer containing an upper layer matrix 82 and upper layer particles 81 may cover the entire second surface of the phosphor layer 21 or may cover only the area exposing from the opening.

The wavelength converter 17 of this embodiment can be formed by the same production process as that in First Embodiment, excluding the area and the position of the layer formed in the printing process. That is, the phosphor layer 21 is formed that the area of the phosphor layer 21 is larger than the area of the phosphor layer 20 of First Embodiment. The light reflective layer 34 is formed on the phosphor layer 21.

EXAMPLES

The present disclosure will now be described in detail by examples and comparative examples. The present disclosure is not limited to the following examples.
Transmission-Type Light Source Light sources having the structures according to First or Second Embodiment shown in FIGS. 1 and 2 were used as examples of the transmission-type light source. A semiconductor laser having an emission peak at a wavelength of 445 nm was used as the semiconductor light emitting device. The phosphor layer was irradiated with light from the light transmissive substrate side of the wavelength converter at an incident light power of 3 W and a light irradiation diameter of 0.6 mm. A sapphire substrate was used. An antireflection film was formed on the light incidence side of the substrate, and a dielectric multilayer film was formed on the phosphor layer side of the substrate. A phosphor layer having a diameter of 0.6 mm and a thickness of 33 µm was formed using YAG phosphor particles (particle diameter: 9 µm, refractive index n=1.75). The luminance characteristics of the light sources were evaluated by measurement with a luminance meter (Lumicam 1300, manufactured by Instrument systems).

Example 1

A wavelength converter was produced using zinc oxide (n=1.95) as the first matrix of the phosphor layer, titanium oxide (n=2.70) as the inorganic compound particles of the light reflective layer, and silicone (n=1.45) as the second matrix. The luminance characteristic of the light source was evaluated. The result of the evaluation is shown in Table 1.

Comparative Example 1

Figure 6:
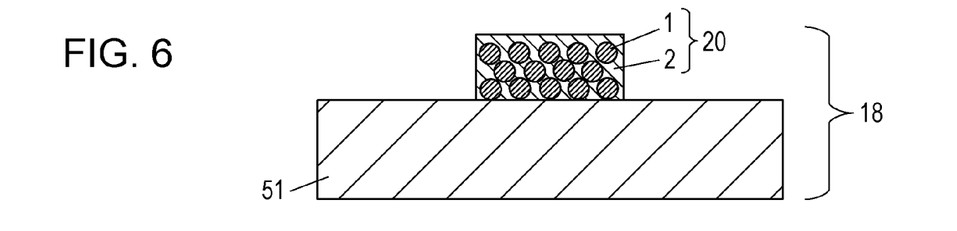
FIG. 6 is a configuration diagram schematically illustrating the structure of a wavelength converter according to Comparative Example 1.

A wavelength converter was produced as in Example 1 except that the light reflective layer was not formed (see the wavelength converter 18 shown in FIG. 6). The luminance characteristic of the resulting wavelength converter was evaluated. Table 1 shows the luminance characteristics in Examples and Comparative Examples as a rate relative to the luminance characteristic in Comparative Example 1 defined as 100%. The luminance characteristic in Example 1 was improved compared to that in Comparative Example 1.

Comparative Example 2

A wavelength converter was produced as in Example 1 except that zinc oxide (n=1.95) was used as the second matrix. The luminance characteristic of the light source was evaluated. The result is shown in Table 1. In Comparative Example 2, the refractive index of the second matrix was higher than that of the phosphor particles. The luminance characteristic was improved in Example 1, where the refractive index of the phosphor particles was higher than that of the second matrix, compared to that in Comparative Example 2.

Comparative Example 3

A wavelength converter was produced as in Example 1 except that glass (n=1.50) was used as the first matrix. The luminance characteristic of the light source was evaluated. The result is shown in Table 1. In Comparative Example 3, the refractive index of the phosphor particles was higher than that of the first matrix. The luminance characteristic in Comparative Example 3 was reduced compared to that in Example 1.

Example 2

A wavelength converter was produced as in Example 1 except that niobium oxide (n=2.30) was used as the inorganic compound particles. The luminance characteristic of the light source was evaluated. The result is shown in Table 1. The luminance characteristic was improved in Example 2 compared to Comparative Examples 1 to 3.

Example 3

A wavelength converter was produced as in Example 1 except that tantalum oxide (n=2.20) was used as the inorganic compound particles, and the luminance characteristic of the light source was evaluated. The result is shown in Table 1. The luminance characteristic was improved in Example 3 compared to Comparative Examples 1 to 3.

Example 4

A wavelength converter was produced as in Example 1 except that zirconium oxide (n=2.40) was used as the inorganic compound particles, and the luminance characteristic of the light source was evaluated. The result is shown in Table 1. The luminance characteristic was improved in Example 4 compared to Comparative Examples 1 to 3.

Example 5

A wavelength converter was produced as in Example 1 except that silicone (n=1.45) was used as the upper layer film formed in an upper portion of the phosphor layer, and the luminance characteristic of the light source was evaluated. The result is shown in Table 1. The luminance characteristic was improved in Example 5 compared to Example 1, showing an increase in luminance by forming a film having a refractive index lower than that of the first matrix of the upper layer on the phosphor layer.

Example 6

A wavelength converter was produced as in Example 5 except that glass was used as the second matrix and that barium fluoride (n=1.45) was used as the upper layer film formed in an upper portion of the phosphor layer, and the luminance characteristic of the light source was evaluated. The result is shown in Table 1. The luminance characteristic was improved in Example 6 compared to Example 1.

Example 7

A wavelength converter was produced as in Example 5 except that glass was used as the upper layer film formed in an upper portion of the phosphor layer, and the luminance characteristic of the light source was evaluated. The result is shown in Table 1. The luminance characteristic was improved in Example 7 compared to Example 1.

Example 8

A wavelength converter was produced as in Example 5 except that glass was used as the second matrix and that silicon dioxide (n=1.50) was used as the upper layer film formed in an upper portion of the phosphor layer, and the luminance characteristic of the light source was evaluated. The result is shown in Table 1. The luminance characteristic was improved in Example 8 compared to Example 1.

TABLE 1

| | Phosphor | First matrix | Inorganic compound particles | Second matrix | Phosphor layer Upper layer film | Luminance characteristic (rate relative to Comparative Example 1) |
|---|---|---|---|---|---|---|
| Comparative Example 1 | YAG (n = 1.75) | ZnO (n = 1.95) | — | — | — | 100% |
| Comparative Example 2 | YAG (n = 1.75) | ZnO (n = 1.95) | $TiO_2$ (n = 2.70) | ZnO (n = 1.95) | — | 102% |
| Comparative Example 3 | YAG (n = 1.75) | glass (n = 1.50) | $TiO_2$ (n = 2.70) | silicone (n = 1.45) | — | 90% |
| Example 1 | YAG (n = 1.75) | ZnO (n = 1.95) | $TiO_2$ (n = 2.70) | silicone (n = 1.45) | — | 120% |
| Example 2 | YAG (n = 1.75) | ZnO (n = 1.95) | $Nb_2O_5$ (n = 2.30) | glass (n = 1.50) | — | 115% |
| Example 3 | YAG (n = 1.75) | ZnO (n = 1.95) | $Ta_2O_5$ (n = 2.20) | silicone (n = 1.45) | — | 114% |
| Example 4 | YAG (n = 1.75) | ZnO (n = 1.95) | ZrO (n = 2.40) | glass (n = 1.50) | — | 117% |
| Example 5 | YAG (n = 1.75) | ZnO (n = 1.95) | $TiO_2$ (n = 2.70) | silicone (n = 1.45) | silicone (n = 1.45) | 125% |
| Example 6 | YAG (n = 1.75) | ZnO (n = 1.95) | $TiO_2$ (n = 2.70) | glass (n = 1.50) | $BaF_2$ (n = 1.45) | 126% |
| Example 7 | YAG (n = 1.75) | ZnO (n = 1.95) | $TiO_2$ (n = 2.70) | silicone (n = 1.45) | glass (n = 1.50) | 122% |

TABLE 1-continued

|  | Phosphor | First matrix | Inorganic compound particles | Second matrix | Phosphor layer Upper layer film | Luminance characteristic (rate relative to Comparative Example 1) |
|---|---|---|---|---|---|---|
| Example 8 | YAG (n = 1.75) | ZnO (n = 1.95) | TiO$_2$ (n = 2.70) | glass (n = 1.50) | SiO$_2$ (n = 1.50) | 123% |

Reflection-Type Light Source

Light sources having Third and Fourth Embodiments respectively shown in FIGS. 3 and 4 were used as examples of the reflection-type light source. A semiconductor laser having an emission peak at a wavelength of 445 nm was used as the semiconductor light emitting device. The phosphor layer of the wavelength converter was irradiated with at an incident light power of 3 W and a light irradiation diameter of 0.6 mm. A silicon substrate was used as the reflecting substrate. An antireflection film was formed on the light incidence side of the substrate, and a dielectric multilayer film was formed on the phosphor layer side of the substrate. A phosphor layer having a diameter of 0.6 mm and a thickness of 60 μm was formed using YAG phosphor particles (particle diameter: 9 μm, refractive index n: 1.75). The luminance characteristics of the light sources were evaluated by measurement with a luminance meter (Lumicam 1300, manufactured by Instrument systems).

Comparative Example 4

A wavelength converter was produced except that zinc oxide (n=1.95) was used as the first matrix of the phosphor layer and that the light reflective layer was not formed, and the luminance characteristic of the light source was evaluated. Table 2 shows the luminance characteristics in Examples as a rate relative to the luminance characteristic in Comparative Example 4 defined as 100%.

Example 9

A wavelength converter was produced using zinc oxide (n=1.95) as the first matrix of the phosphor layer, titanium oxide (n=2.70) as the inorganic compound particles of the reflective layer, and silicone (n=1.45) as the second matrix, and the luminance characteristic was evaluated. Table 2 shows the result. The luminance characteristic in Example 9 was improved to 113% relative to that of Comparative Example 4.

Example 10

A wavelength converter was produced as in Example 9 except that silicon dioxide (n=1.50) was used as the upper layer particles and that zinc oxide (n=1.95) was used as the upper layer matrix, and the luminance characteristic was evaluated. Table 2 shows the result. The luminance characteristic was improved in Example 10 compared to Comparative Example 4.

Example 11

A wavelength converter was produced as in Example 9 except that glass (n=1.50) was used as the upper layer particles and that zinc oxide (n=1.95) was used as the upper layer matrix, and the luminance characteristic was evaluated. Table 2 shows the result. The luminance characteristic in Example 11 was improved compared to Comparative Example 4.

Example 12

A wavelength converter was produced as in Example 9 except that barium sulfate (n=1.65) was used as the upper layer particles and that silicone (n=1.45) was used as the upper layer matrix, and the luminance characteristic was evaluated. Table 2 shows the result. The luminance characteristic in Example 12 was improved compared to Comparative Example 4.

Example 13

A wavelength converter was produced as in Example 9 except that magnesium oxide (n=1.72) was used as the upper layer particles and that silicone (n=1.45) was used as the upper layer matrix, and the luminance characteristic was evaluated. Table 2 shows the result. The luminance characteristic was improved in Example 13 compared to Comparative Example 4.

TABLE 2

|  | Phosphor | First matrix | Inorganic compound particles | Second matrix | Phosphor layer Upper layer film | Upper layer matrix | Luminance characteristic (rate relative to Comparative Example 4) |
|---|---|---|---|---|---|---|---|
| Comparative Example 4 | YAG (n = 1.75) | ZnO (n = 1.95) | — | — | — | — | 100% |
| Example 9 | YAG (n = 1.75) | ZnO (n = 1.95) | TiO$_2$ (n = 2.70) | silicone (n = 1.45) | — | — | 113% |
| Example 10 | YAG (n = 1.75) | ZnO (n = 1.95) | TiO$_2$ (n = 2.70) | silicone (n = 1.45) | SiO$_2$ (n = 1.50) | ZnO (n = 1.95) | 122% |
| Example 11 | YAG (n = 1.75) | ZnO (n = 1.95) | TiO$_2$ (n = 2.70) | silicone (n = 1.45) | glass (n = 1.50) | ZnO (n = 1.95) | 121% |
| Example 12 | YAG (n = 1.75) | ZnO (n = 1.95) | TiO$_2$ (n = 2.70) | silicone (n = 1.45) | BaSO$_4$ (n = 1.65) | silicone (n = 1.45) | 117% |

TABLE 2-continued

|  | Phosphor | First matrix | Inorganic compound particles | Second matrix | Phosphor layer Upper layer film | Upper layer matrix | Luminance characteristic (rate relative to Comparative Example 4) |
|---|---|---|---|---|---|---|---|
| Example 13 | YAG (n = 1.75) | ZnO (n = 1.95) | $Nb_2O_5$ (n = 2.30) | glass (n = 1.45) | MgO (n = 1.72) | silicone (n = 1.45) | 115% |

The light source comprising a wavelength converter of the present disclosure can be used as a light source in, for example, an ordinary light system, such as a ceiling light; a special lighting system, such as a spotlight, a light for stadium, or a light for studio; a lighting system for a vehicle, such as a head lamp; a projector or head up display projector; a light for an endoscope; an imaging apparatus, such as a digital camera, a mobile phone, or a smartphone; or a liquid crystal display of, for example, a monitor for a personal computer (PC), a notebook personal computer, a television, a personal digital assistant (PDA), a smartphone, a tablet PC, or a mobile phone.

What is claimed is:

1. A light source comprising:
   a semiconductor light emitting device; and
   a wavelength converter that receives light emitted from the semiconductor light emitting device and emits converted light, the wavelength of the converted light being different from the wavelength of the light from the semiconductor light emitting device, wherein
   the wavelength converter comprises:
      a substrate;
      a phosphor layer disposed directly on the substrate; and
      a light reflective layer disposed directly on the substrate, the light reflective layer surrounding the phosphor layer, wherein:
   the phosphor layer includes phosphor particles and a first matrix material in which the phosphor particles are embedded and dispersed,
   the light reflective layer includes inorganic compound particles and a second matrix material in which the inorganic compound particles are embedded and dispersed,
   the inorganic compound particles have a refractive index higher than a refractive index of the first matrix material,
   the first matrix material has the refractive index higher than a refractive index of the phosphor particles, and
   the phosphor particles have the refractive index higher than a refractive index of the second matrix material.

2. The light source according to claim 1, wherein the first matrix material is zinc oxide.

3. The light source according to claim 1, wherein the second matrix material is one or a combination selected from the group consisting of glass and compounds having siloxane skeletons.

4. The light source according to claim 1, wherein the inorganic compound particles comprises one or a combination selected from the group consisting of titanium oxide, zirconium oxide, niobium oxide, tantalum oxide, and barium titanate.

5. The light source according to claim 1, wherein
   the phosphor layer has a first surface facing the substrate and a second surface opposite to the first surface;
   the substrate transmits light having a wavelength of 470 nm or less;
   the wavelength converter further comprises a visible light transmissive film having a refractive index lower than that of the first matrix; and
   the visible light transmissive film is disposed on the second surface of the phosphor layer.

6. The light source according to claim 5, wherein the visible light transmissive film comprises one or a combination selected from the group consisting of glass, compounds having siloxane skeletons, silicon dioxide, and barium fluoride.

7. The light source according to claim 1, wherein
   the phosphor layer has a first surface facing the substrate and a second surface opposite to the first surface;
   the substrate reflects light having a wavelength of 380 to 780 nm;
   the wavelength converter further comprises a first layer containing first particles having a refractive index lower than that of the phosphor particles; and
   the first layer is disposed on the second surface of the phosphor layer.

8. The light source according to claim 7, wherein the first particles comprise one or a combination selected from the group consisting of silicon dioxide, barium sulfate, and magnesium oxide.

9. The light source according to claim 1, wherein
   the substrate has a third surface;
   the phosphor layer is disposed on the third surface of the substrate and has a first thickness; and
   the reflective layer is disposed on the third surface of the substrate and has a second thickness equal to the first thickness.

10. The light source according to claim 1, wherein
   the substrate has a third surface;
   the phosphor layer is disposed on the third surface of the substrate and has a first thickness; and
   the reflective layer is disposed on the third surface of the substrate and has a second thickness smaller than the first thickness.

11. The light source according to claim 1, wherein
   the substrate has a third surface;
   the phosphor layer is disposed on the third surface of the substrate and has a first thickness;
   the reflective layer is disposed on the third surface of the substrate and has a second thickness larger than the first thickness.

12. The light source according to claim 1, wherein
   the substrate has a third surface;
   the phosphor layer is disposed on the third surface of the substrate and has a first surface facing the substrate and a second surface opposite to the first surface; and
   the reflective layer is disposed on the third surface of the substrate and on the second surface of the phosphor layer and has an opening on the second surface.

13. A light source comprising:

a semiconductor light emitting device; and a wavelength converter that receives light emitted from the semiconductor light emitting device and emits converted light, the wavelength of the converted light being different from the wavelength of the light from the semiconductor light emitting device, wherein the wavelength converter includes:

a substrate;

a phosphor layer disposed directly on the substrate and has a first surface facing the substrate and a second surface opposite to the first surface; and a light reflective layer disposed directly on the second surface of the phosphor layer and has an opening on the second surface, wherein the phosphor layer includes phosphor particles and a first matrix material in which the phosphor particles are embedded and dispersed;

the light reflective layer includes inorganic compound particles and a second matrix material in which the inorganic compound particles are embedded and dispersed;

the inorganic compound particles have a refractive index higher than a refractive index of the first matrix material, the first matrix material has the refractive index higher than a refractive index of the phosphor particles, and the phosphor particles have the refractive index higher than a refractive index of the second matrix material.

14. The light source according to claim 5, wherein the substrate transmits light having a wavelength equal to or more than 100 nm and equal to or less than 470 nm.

15. The light source according to claim 5, wherein the substrate transmits light having a wavelength equal to or more than 250 nm and equal to or less than 470 nm.

* * * * *